(12) United States Patent
Marotta et al.

(10) Patent No.: US 6,795,343 B2
(45) Date of Patent: Sep. 21, 2004

(54) BAND-GAP VOLTAGE REFERENCE

(75) Inventors: Giulio Marotta, Contigliano (IT); Agostino Macerola, San Bernedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 10/365,586

(22) Filed: Feb. 12, 2003

(65) Prior Publication Data

US 2003/0202380 A1 Oct. 30, 2003

(30) Foreign Application Priority Data

Apr. 30, 2002 (IT) ..................................... RM2002A0236

(51) Int. Cl.[7] ............................................... G11C 11/34
(52) U.S. Cl. .................... 365/185.18; 327/540
(58) Field of Search ................... 365/185.18, 185.2; 327/540

(56) References Cited

U.S. PATENT DOCUMENTS

| | | | |
|---|---|---|---|
| 5,027,053 A | 6/1991 | Ohri | 257/612 |
| 5,049,966 A | 9/1991 | Wald | 257/612 |
| 5,384,739 A | 1/1995 | Keeth | 365/189.09 |
| 5,481,179 A | 1/1996 | Keeth | 323/315 |
| 5,839,060 A * | 11/1998 | Kasperkovitz et al. | 455/226.2 |
| 6,316,995 B1 * | 11/2001 | Chen et al. | 330/252 |

\* cited by examiner

*Primary Examiner*—M. Tran
(74) *Attorney, Agent, or Firm*—Leffert Jay & Polglaze, P.A.

(57) ABSTRACT

An improved band-gap voltage reference apparatus and method is detailed that incorporates an amplifier to provide for improved compensation and temperature stability to the voltage reference circuit by increasing the effective $h_{FE}$ (also called $\beta$) of the bipolar junction transistors (BJTs) used in the band-gap voltage reference circuit. This also allows the band-gap voltage reference circuit to operated with a lower overall power usage and with lower supply voltages. Additionally, the improved band-gap voltage reference apparatus and method also allows for band-gap voltage references to be implemented in integrated circuit technologies that do not have high quality BJTs natively available in the manufacturing process of the technology.

32 Claims, 4 Drawing Sheets

BAND-GAP VOLTAGE REFERENCE

RELATED APPLICATION

This application claims priority to Italian Patent Application Serial No. RM2002A000236, filed Apr. 30, 2002, entitled "BAND-GAP VOLTAGE REFERENCE," which is commonly assigned.

TECHNICAL FIELD OF THE INVENTION

The present invention relates generally to integrated circuits and in particular the present invention relates to low power/low voltage band-gap voltage reference circuits.

BACKGROUND OF THE INVENTION

Integrated circuits often contain voltage reference circuits to provide a stable reference voltage for use with internal circuit operations. The voltage reference circuit is key in many integrated circuits (ICs) and memories where it is vital to have a stable reference voltage for use in many other circuits of the IC or memory. One such commonly used voltage reference is the band-gap voltage reference circuit.

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks". Each of the cells within an erase block can be electrically programmed in a random basis by charging the floating gate. The charge can be removed from the floating gate by a block erase operation, wherein all floating gate memory cells in the erase block are erased in a single operation.

ICs and memories are designed to operate over a set range of supply voltages and temperatures. In modern ICs and memories the supply voltages have become increasingly smaller, which in part decreases the power usage in these circuits. A number of variations of the band-gap voltage reference circuit are available in the art to compensate the band-gap reference circuit over the ranges of operating temperatures. However, these circuits become less effective at compensation as the supply voltage gets lower. An example of this is in modern Flash memories where the operating voltage is 1.65V and the operating temperature range is −40° C. to 85° C. The situation is even more problematic in portable devices as total power used becomes more of an issue and the band-gap voltage reference circuit must draw as little current as possible (typically no more than 10 $\mu$A). Further compounding the issue is the fact that band-gap voltage references typically utilize bipolar junction transistors (BJTs) in their circuits and many of the ICs and memories that they are implemented in do not natively offer high quality BJTs in the underlying integrated circuit technology they are manufactured in.

For the reasons stated above, and for other reasons stated below which will become apparent to those skilled in the art upon reading and understanding the present specification, there is a need in the art for an improved compensated band-gap voltage in modern ICs and memory circuits.

SUMMARY OF THE INVENTION

The above-mentioned problems with operating, manufacturing, and temperature compensating band-gap voltage reference devices in a modern low power or low voltage IC or memory device are addressed by the present invention and will be understood by reading and studying the following specification.

In one embodiment, a band-gap voltage reference includes a current mirror coupled to an upper power rail, a first bipolar junction transistor having a collector coupled to the current mirror through a first resistor, and an emitter coupled to a lower power rail, a second bipolar junction transistor having a collector coupled to the current mirror, and a base coupled to a base of the first bipolar transistor, a second resistor coupled between an emitter of the second bipolar junction transistor and the lower power rail, and an amplifier circuit having an input coupled to the collector and an output coupled to the base of the first bipolar junction transistor.

In another embodiment, an integrated circuit includes a first internal circuit with an output, a second internal circuit with an input, and a band-gap voltage reference coupled to the output of the first internal circuit and a voltage reference output of the band-gap voltage reference coupled to the input of the second internal circuit. The band-gap voltage reference includes a current mirror coupled to a first power rail, a first bipolar junction transistor having a collector coupled to the current mirror through a first resistor, and an emitter coupled to a second power rail, a voltage reference output coupled to the first resistor and to the current mirror, a second bipolar junction transistor having a collector coupled to the current mirror, and a base coupled to a base of the first bipolar transistor, a second resistor coupled between an emitter of the second bipolar junction transistor and the second power rail, and an amplifier circuit having an input coupled to the collector of the first bipolar junction transistor and an output coupled to the base of the first bipolar junction transistor.

In yet another embodiment, a band-gap voltage reference includes a current mirror circuit, a first NPN bipolar junction transistor having a collector coupled to a drain of a first PMOS transistor of the current mirror circuit through a first resistor, and an emitter coupled to a second power rail, a second NPN bipolar junction transistor that has a base-emitter junction area that is larger than a base-emitter junction area of the first NPN bipolar junction, having a collector coupled to a drain of a second PMOS transistor of the current mirror circuit, and a base of the second NPN bipolar junction transistor coupled to a base of the first NPN bipolar transistor, a second resistor coupled between an emitter of the second NPN bipolar junction transistor and the second power rail, and an amplifier circuit. The current mirror circuit includes a first PMOS transistor having a source coupled to a first power rail, and a second PMOS transistor having a source coupled to the first power rail and a gate of the second PMOS transistor coupled a drain of the second PMOS transistor and to a gate of the first PMOS transistor. The amplifier circuit has an input coupled to the collector of the first NPN bipolar junction transistor and an output coupled to the base of the first NPN bipolar junction transistor. The amplifier circuit includes a capacitor coupled between the input and the output, a third NPN bipolar junction transistor having a base coupled to the input through a third resistor, and an emitter coupled to the second power rail, a NMOS transistor having a source coupled to the second power rail through a fourth resistor, a gate coupled to a collector of the third NPN bipolar junction transistor, and a drain coupled to the output, a third PMOS transistor having a source coupled to the first power rail, a gate coupled to the gate of the second PMOS transistor of the current mirror circuit, and a drain coupled to the collector of the third NPN bipolar junction transistor, and one or more fourth PMOS transistors having a source of each of the one or more fourth PMOS transistors coupled to the first power rail, a gate of each of the one or more fourth PMOS transistors coupled to the gate of the second PMOS transistor of the current mirror circuit, and a drain of the one or more fourth PMOS transistors coupled to the output.

In a further embodiment, a non-volatile memory includes a non-volatile memory array, a controller circuit, and at least one band-gap voltage reference. The at least one band-gap voltage reference includes a current mirror coupled to a positive power rail, a first bipolar junction transistor having a collector coupled to the current mirror through a first resistor, and an emitter coupled to a negative power rail, a second bipolar junction transistor having a collector coupled to the current mirror, and a base coupled to a base of the first bipolar transistor, a second resistor coupled between an emitter of the second bipolar junction transistor and the negative power rail, and an amplifier circuit having an input coupled to the collector and an output coupled to the base of the first bipolar junction transistor.

In yet a further embodiment, a method of operating a band-gap voltage reference that includes a current mirror coupled to an upper power rail, a first bipolar junction transistor having a collector coupled to the current mirror through a first resistor, and an emitter coupled to a lower power rail, a second bipolar junction transistor having a collector coupled to the current mirror, and a base coupled to a base of the first bipolar transistor, a second resistor coupled between an emitter of the second bipolar junction transistor and the lower power rail, and an amplifier circuit having an input coupled to the collector and an output coupled to the base of the first bipolar junction transistor, includes operating the amplifier circuit to provide an amplified current from the collector of the first bipolar junction transistor to the base of the first bipolar junction transistor.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention include band-gap voltage reference circuits that incorporate an amplifier to provide for improved compensation and temperature stability, allowing the band-gap voltage reference circuit to operated with a lower overall power usage and with lower supply voltages. Band-gap voltage reference circuit embodiments of the present invention also can be implemented in integrated circuit technologies that do not have high quality BJTs natively available in the technologies' manufacturing process.

Typical Band-gap voltage reference circuits utilize the forward biased junction voltage drop of a diode or the base-emitter diode junction of a BJT to set a reference voltage. In a forward biased junction of a diode or the base-emitter diode junction of a BJT, the forward current is $I_b = I_0 e^{v_{be}/v_t}$, where $I_0$ is the diode saturation current and is proportional to the area of the diode junction or the base-emitter area of the BJT, and $v_{be}$ is the diode or base-emitter voltage. The term $v_t$ is defined as $v_t = kT/q$, where k is the Boltzmann constant, T is the absolute temperature, and q is the electron charge. It is noted that resultant $v_{be}$ from the above equation changes at $-2$ mV/° C. at a constant forward bais current, $I_b$, and must be compensated for if used as a voltage reference.

Figure 1:
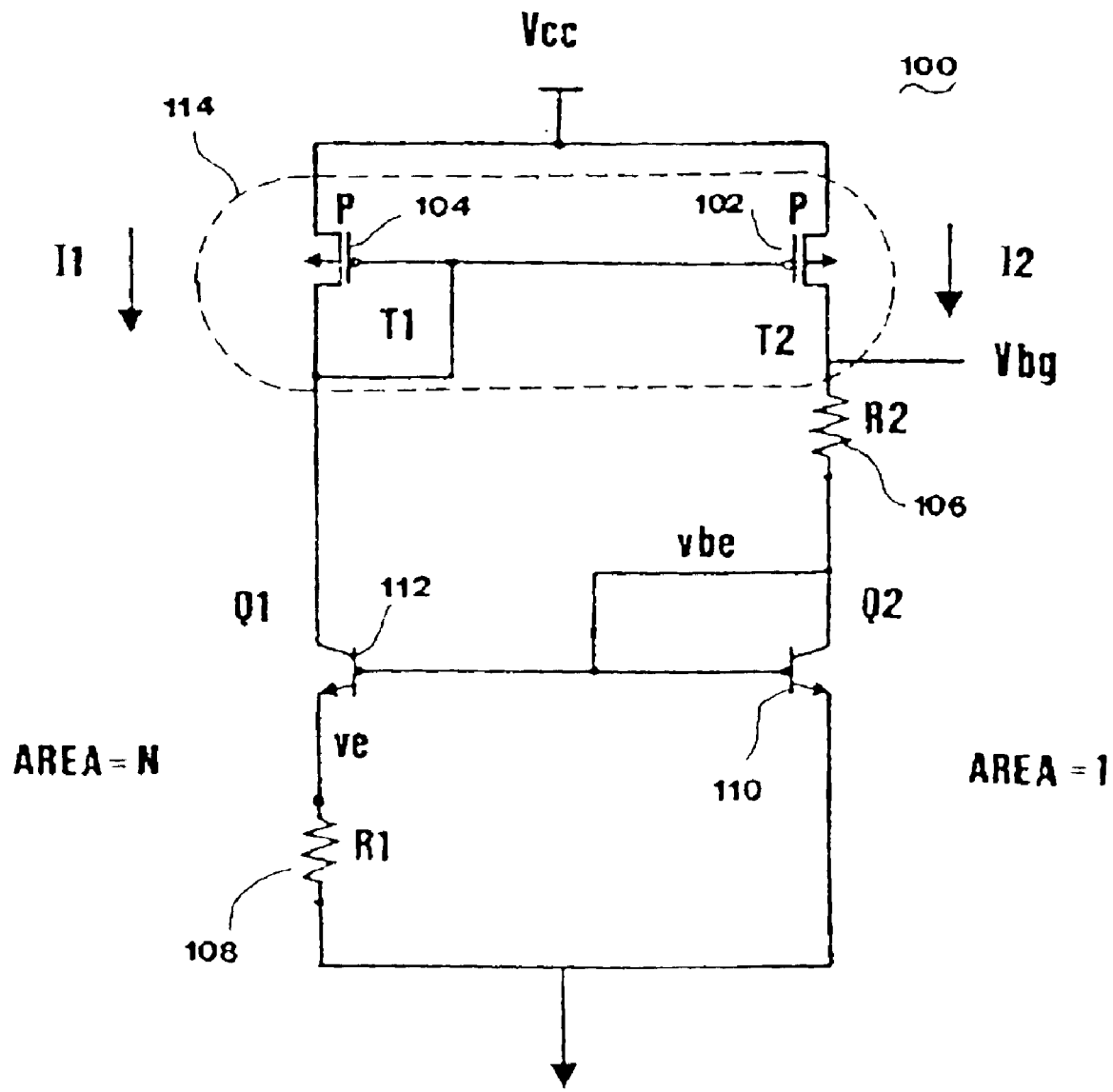
FIG. 1 is a simplified diagram of a band-gap voltage reference.

FIG. 1 is a simplified diagram of a band-gap reference circuit 100 that contains two positive metal oxide semiconductor (PMOS) transistors 102, 104, resistors 106, 108, and two NPN BJTs 110, 112. PMOS transistors 102 and 104 are arranged in a current mirror circuit 114. In the current mirror circuit 114 the sources of the PMOS transistors 102, 104 are coupled to the upper power rail (Vcc), the gate of PMOS transistor 104 is coupled to its drain, and the gate of PMOS transistor 102 is coupled to the gate of PMOS transistor 104. The collector of the second NPN BJT 110 is coupled to the drain of PMOS transistor 102 of the current mirror 114 through resistor R2 106. The emitter of NPN transistor 110 is coupled to the lower power rail (ground). The collector of NPN transistor 110 is also coupled to its base, putting the NPN transistor 110 in what is called "diode coupled mode" giving the NPN transistor 110 the I-V characteristics of a PN junction diode. The first NPN BJT 112 has a base-emitter junction size that is N times larger than that of the second NPN BJT 110, where N is >1; increasing N has the effect of modifying the current amplification, $\beta$ or $h_{FE}$, of the BJT. The collector of the first NPN BJT 112 is coupled to the drain of PMOS transistor 104 of the current mirror 114, and the base is coupled to the lower power rail (ground) through resistor R1 108. The generated reference voltage $V_{bg}$ is taken from the node between resistor R2 106 and PMOS transistor 102 of the current mirror circuit 114.

In operation, the current flowing through the diode connected NPN BJT 110 sets the voltage $V_{be}$ at the coupled base and collector. The voltage level $V_{be}$ in turn enables the first NPN BJT 112 and sets it into active mode. The voltage level at the collector of the active first NPN BJT 112 sets the current flow in PMOS transistor 104 of the current mirror circuit 114 by pulling down its coupled gate and drain. The current mirror circuit 114 generates two identical currents ($I_1=I_2$). In this, PMOS transistor 104 operates in saturation with its gate tied to its drain, yielding a constant current at $V_{gs}$. As the gate of PMOS transistor 102 is tied to the gate of PMOS transistor 104, and it is of the same size and characteristics, it flows the same current as PMOS transistor 104 with negligible differences. The constant current set by this feedback loop (second NPN BJT 110 to first NPN BJT 112 to PMOS transistor 104 to PMOS transistor 102) sets the voltage drop across resistor R2 106, which in combination with the voltage level $V_{be}$ gives the band-gap voltage reference circuit 100 output voltage $V_{bg}$ as sampled at the drain of PMOS transistor 102.

The current $I_2$ flows through resistor R2 106 to the diode coupled second NPN BJT 110. As the collector of NPN BJT 110 is coupled to its base it is at the same voltage level as the base (Vbe). The voltage Vbe can determined, as stated above, from the diode equation $I_{B1}=I_0 e^{v_{be}/v_t}$, where $v_t=kT/q$. With the base of the first NPN BJT 112 coupled to the base of the diode coupled second NPN BJT 110 its base voltage is at the same level as that of the second NPN BJT 110. The base-emitter diode voltage drop of the first NPN BJT 112, however, is minus the voltage drop, $V_e$, across the resistor R1 108, and the base-emitter junction is N times larger than that of the second NPN BJT 110. Thus the diode equation of the first NPN BJT 112 is $I_{B2}=NI_0 e^{(v_{be}-v_e)/v_t}$, where $v_t=kT/q$.

$I_1$ is only coupled to the collector of the first NPN BJT 112, thus $I_1=I_{C1}$. $I_2=I_{C2}+I_{B2}+I_{B1}$ because of the diode coupling of the second NPN BJT 110 and the coupled base of the first NPN BJT 112. The collector currents due to the basic current amplification operation of the NPN BJT transistors 110, 112 is $I_{C2}=\beta_2 I_{B2}$, and $I_{C1}=\beta_1 I_{B1}$, where $\beta$ also called $h_{FE}$. As $I_1=I_2$, due to the operation of the current mirror circuit 114, the collector and base currents of the two NPN BJT transistors are related by the equation $I_1=I_{C1}=I_{C2}+I_{B2}+I_{B1}=I_2$.

If, in the best case, $\beta_1$ and $\beta_2$ are large ($\beta_1, \beta_2 >> 1$), we can assume that $I_{B2}$ and $I_{B1}$ are small, and thus can be ignored giving $I_2=I_{C2}$ and therefore $I_2=I_1=I_{C2}=I_{C1}=\beta_2 I_{B2}=\beta_1 I_{B1}$. If $\beta_2=\beta_1$, which can be assumed for BJTs made on the same semiconductor chip with the same process, then $I_{B2}=I_{B1}$ and thus $I_{B2}=I_{B1}=I_0 e^{v_{be}/v_t}=NI_0 e^{(v_{be}-v_e)/v_t}$. This gives $v_e=v_t \ln N=(kT \ln N)/q$, where $v_e$ is the voltage at the emitter of the first NPN BJT 112, which is the same as $v_e=(I_1+I_{B1})R_1$, or $v_e=I_1 R_1$ if $\beta_1$ is assumed large and thus $I_{B1}$ is small. Since $I_2=I_1$, because of the current mirror circuit 114, we can rewrite this as $v_e=I_2 R_1$ which gives $I_2=v_e/R_1$, which in turn yields $I_2=(kT \ln N)/R_1 q$ when $v_e$ is substituted for.

The reference voltage $V_{bg}$ is set by the voltage drop across resistor R2 106 and the voltage drop across the diode connected second NPN BJT 110, $V_{be}$. Thus $V_{bg}=V_{be}+I_2 R_2$. Substituting the above equation for $I_2$ yields $V_{bg}=V_{be}+R_2 (kT \ln N)/R_1 q$. As $V_{be}$ changes by $-2$ mV/° C., $R_2$, N, and $R_1$ can be chosen to modify $R_2(kT \ln N)/R_1 q$ to compensate at $+2$ mV/° C. compensating the band-gap voltage reference circuit.

If $\beta_1$ and $\beta_2$ are not large, as in the natively available BJTs in some complementary metal oxide semiconductor (CMOS) manufacturing processes, we cannot assume that $I_{B2}$ and $I_{B1}$ are small, and thus they cannot be ignored. From this we get a new formula for $I_2$ yielding $I_1=I_2=I_{C1}=I_{C2}+I_{B2}+I_{B1}=\beta_2 I_{B2}+I_{B1}+I_{B2}=(\beta_2+1)I_{B2}+I_{B1}$. Since $I_{C1}=\beta_1 I_{B1}$ we get $(\beta_2+1)I_{B2}+I_{B1}=\beta_1 I_{B1}$, giving $(\beta_2+1)I_{B2}=(\beta_1-1)I_{B1}$ instead of the previous $I_{B2}=I_{B1}$ where $\beta_2, \beta_1 >> 1$. Thus we get $(\beta_2+1)I_{B2}=(\beta_1-1)I_{B1}=(\beta_2+1)I_0 e^{v_{be}/v_t}=(\beta_1-1)NI_0 e^{(v_{be}-v_e)/v_t}$. This gives $v_e=v_t \ln [(\beta_1-1)N/(\beta_2+1)]$, which is the same as $v_e=(I_1+I_{B1})R_1=(I_{C1}I_{B1})R_1=I_{R1}R_1$, where $I_{R1}$ is the R1 108 and $I_{C1}$ is the collector current in the first NPN BJT 112. However, $I_{B1}$ in this equation cannot be ignored, as was done above, since $\beta_1$ is not large and thus $I_{B1}$ is non-negligible. Reworking this for $I_{R1}$ and substituting for $v_e$ gains $I_{R1}=v_e/R_1=(v_t/R_1)\ln [(\beta_1-1)N]/(\beta_2+1)$. However $I_{R1}$ also is $I_{R1}=I_{C1}+I_{B1}=I_{C1}+I_{C1}/\beta_1=I_{C1}(\beta_1+1)/\beta_1$ Additionally, since $I_{C1}=I_1=I_2=I_{R2}$, where $I_{R2}$ is the current through the resistor R2 106, we get $I_{R1}=I_{R2}(\beta_1+1)/\beta_1$ or $I_{R2}=I_{R1}\beta_1/(\beta_1+1)$. As stated above, the output voltage reference is $V_{bg}=V_{be}+I_2 R_2$ giving $V_{bg}=V_{be}+R_2 I_{R1}\beta_1/(\beta_1+1)$ or $V_{bg}=V_{be}+[R_2 V_t \beta_1/R_1(\beta_1+1)] \ln [(\beta_1-1)N/(\beta_2+1)]$. The variance of $V_{be}$ of the second NPN BJT 110 is as stated above $-2$ mV/° C., unfortunately in the case of the band-gap voltage reference circuit 100 with low $\beta$ BJTs the term $[R_2 V_t \beta_1/R_1(\beta_1+1)] \ln [(\beta_1-1)N/(\beta_2+1)]$ can vary from the ideal $+2$ mV/° C. by $-14\%$ to $+8\%$ for various choices of N, which is problematic for circuits that utilize the band-gap voltage reference circuit 100, in particular that of a Flash memory where the variation is very undesirable.

Figure 2:
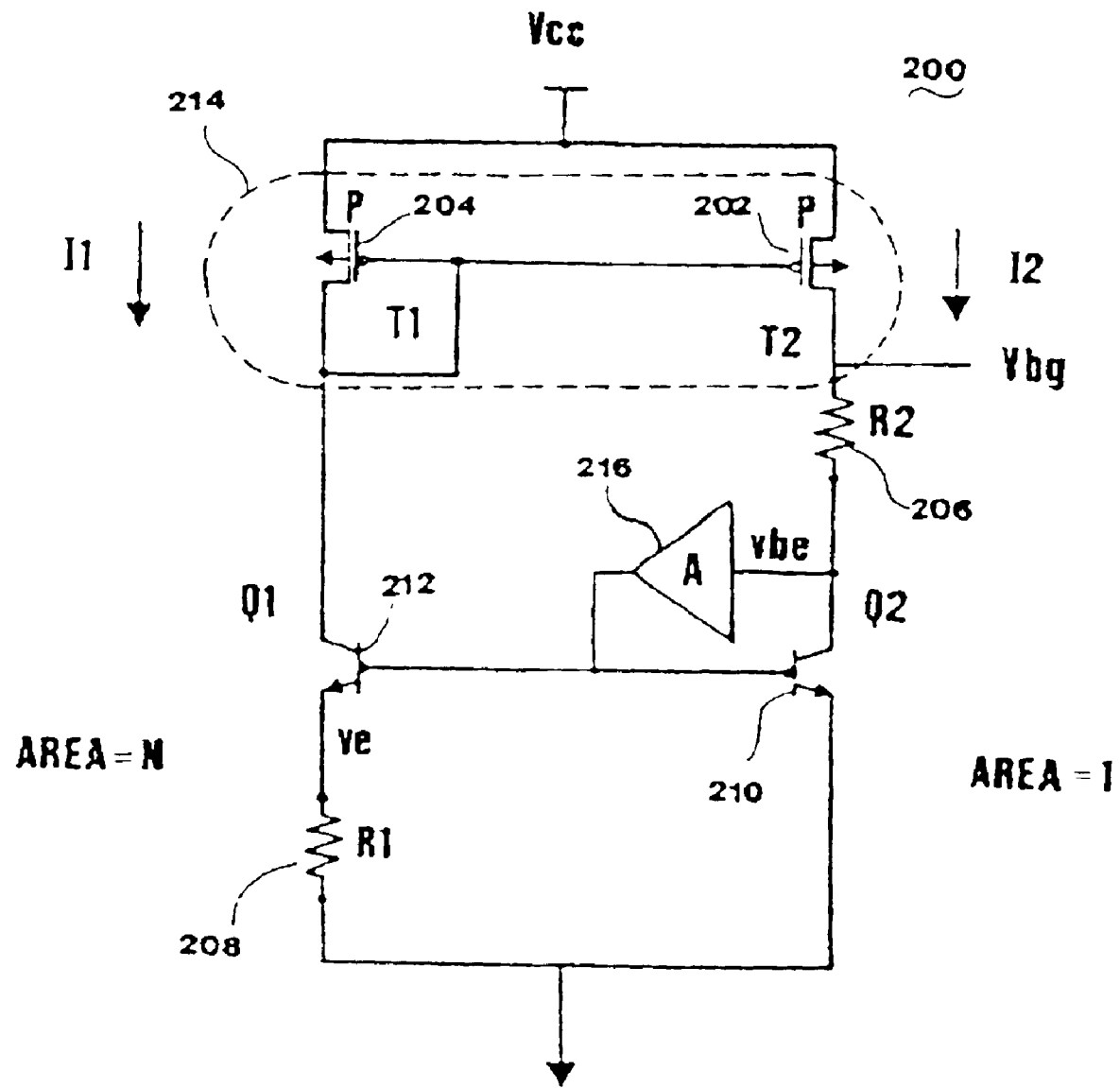
FIG. 2 is a simplified diagram of a band-gap voltage reference embodiment of the present invention.

Band-gap voltage reference circuit embodiments of the present invention operate by increasing the effective $h_{FE}$ (also called $\beta$) of the BJTs used in the band-gap voltage reference circuit. FIG. 2 is a simplified diagram of a band-gap voltage reference circuit 200 of an embodiment of the present invention. The band-gap voltage reference circuit 200 contains two PMOS transistors 202, 204, resistors 206, 208, two NPN BJTs 210, 212, and an amplifier circuit 216. PMOS transistors 202 and 204 are arranged in a current mirror circuit 214. In the current mirror circuit 214 the sources of the PMOS transistors 202, 204 are coupled to the upper power rail (Vcc), the gate of PMOS transistor 204 is coupled to its drain, and the gate of PMOS transistor 202 is coupled to the gate of PMOS transistor 204. The collector of the second NPN BJT 210 is coupled to the drain of PMOS transistor 202 of the current mirror 214 through resistor R2 206. The emitter of NPN transistor 210 is coupled to the lower power rail (ground). The collector of NPN transistor 210 is also coupled to its base through the amplifier 216. The first NPN BJT 212 has a base-emitter junction size that is N times larger than that of the second NPN BJT 210, where N is >1. The collector of the first NPN BJT 212 is coupled to the drain of PMOS transistor 204 of the current mirror 214, and the base is couple to the lower power rail (ground) through resistor R1 208. The generated reference voltage $V_{bg}$ is taken from the node between resistor R2 206 and PMOS transistor 202 of the current mirror circuit 214.

In operation, the output of amplifier 216 provides amplified versions of the base current ($I_{B1}, I_{B2}$) to the bases of the first and second NPN BJTs 212, 210. This amplification increases the effective $\beta$ or $h_{FE}$ of the native NPN BJTs 212, 210 allowing the high $\beta$ approximation analysis of above to be used. The circuit can then be compensated as above by choosing N, R1 208, and R2 206 to be at the desired rate to counteract $V_{be}$ changing at $-2$ mV/° C. The amplifier 216 is preferentially compensated against oscillation and will operate such that it does not disturb the voltage $V_{be}$ on the collector of the second NPN BJT 210.

Figure 3:
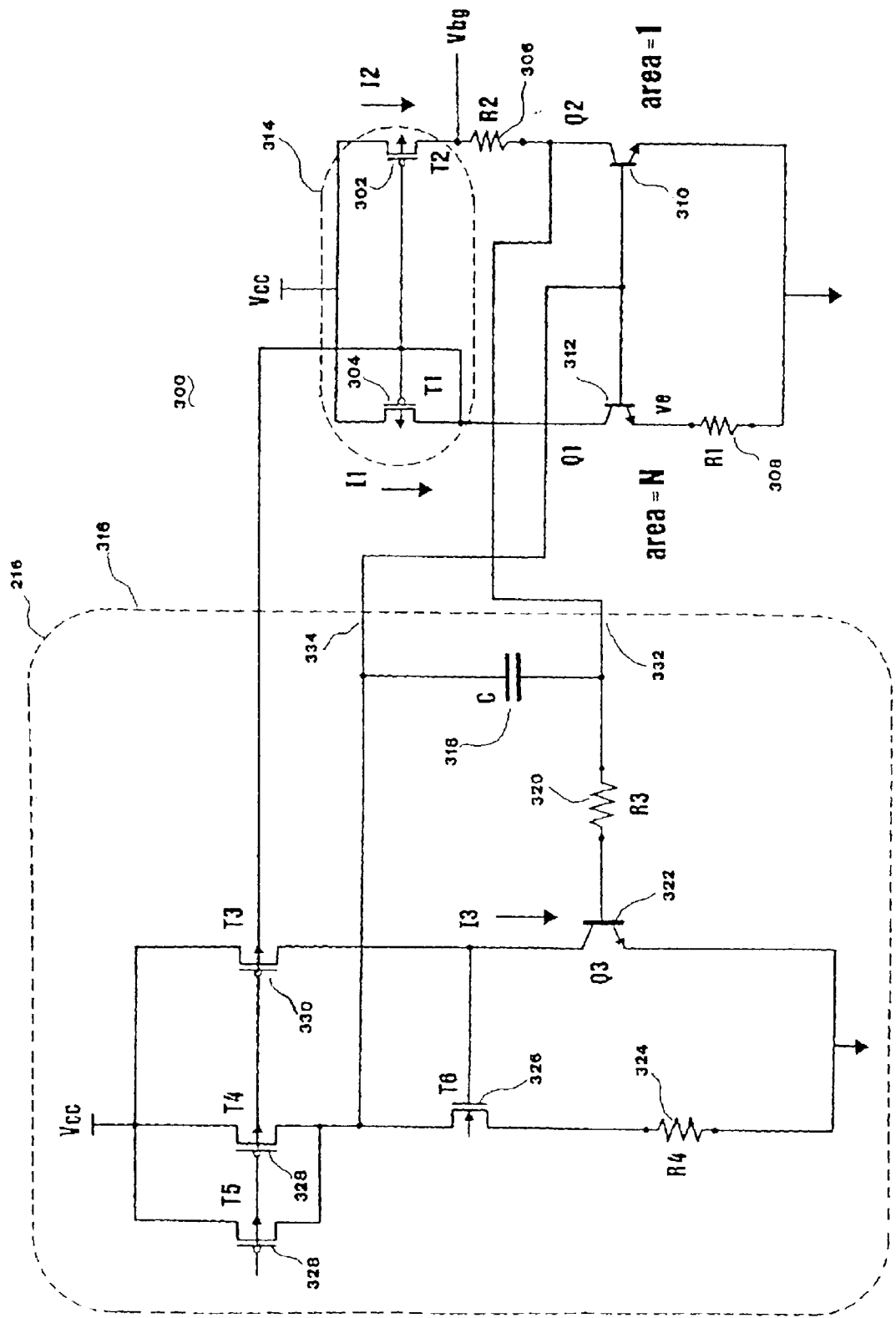
FIG. 3 is a simplified diagram of a band-gap voltage reference of another embodiment of the present invention.

FIG. 3 is a simplified diagram of a band-gap voltage reference of another embodiment of the present invention. The band-gap voltage reference circuit 300 contains two PMOS transistors 302, 304, resistors 306, 308, two NPN BJTs 310, 312, and an amplifier circuit 316 (216'). PMOS transistors 302 and 304 are arranged in a current mirror circuit 314. In the current mirror circuit 314 the sources of the PMOS transistors 302, 304 are coupled to the upper power rail (Vcc), the gate of PMOS transistor 304 is coupled to its drain, and the gate of PMOS transistor 302 is coupled to the gate of PMOS transistor 304. The collector of the second NPN BJT 310 is coupled to the drain of PMOS transistor 302 of the current mirror 314 through resistor R2 306. The emitter of NPN transistor 310 is coupled to the lower power rail (ground). The collector of NPN transistor 310 is also coupled to its base through the amplifier 316. The first NPN BJT 312 has a base-emitter junction size that is N times larger than that of the second NPN BJT 310, where N is >1. The collector of the first NPN BJT 312 is coupled to the drain of PMOS transistor 304 of the current mirror 314, and the base is coupled to the lower power rail (ground) through resistor R1 308. The generated reference voltage $V_{bg}$ is taken from the node between resistor R2 306 and PMOS transistor 302 of the current mirror circuit 314.

The amplifier circuit 316 contains a capacitor 318, resistors 320, 324, a NPN BJT 322, a negative metal oxide semiconductor (NMOS) transistor 326, a PMOS transistor 330, and a selectable number of one or more additional PMOS transistors 328. The amplifier circuit 316 is non-inverting in overall operation and contains two inverting stages. As stated above, the amplifier 316 is preferentially compensated against oscillation and will operate such that it does not disturb the voltage $V_{be}$ on the collector of the second NPN BJT 310. To accomplish this, the amplifier circuit utilizes a NPN BJT 322 for the amplifier input that is identical to the second NPN BJT 310 of the band-gap voltage reference circuit 300 and employs capacitor 318 and resistors R3 320 and R4 324 to compensate the amplifier circuit against possible oscillation. The input 322 is coupled to the collector of the second NPN BJT 310 and the output 334 of the amplifier circuit 316 is coupled to the bases of the first and second NPN BJTs 310, 312. Capacitor 318 is coupled across the input 332 and the output 334 of the amplifier circuit 316 to compensate for possible oscillations. The input of the amplifier circuit 316 is coupled to the input of the first inverting stage of the amplifier, the base of NPN BJT 322, through resistor R3 320. The emitter of the NPN BJT 322 is coupled to the lower power rail (ground) and the collector is coupled to the upper half of the first inverting stage, the drain PMOS transistor 330. The input of the second inverting stage of the amplifier circuit 316, the gate of NMOS transistor 326, is also coupled to the collector of the NPN BJT 322. The source of NMOS transistor 326 is coupled to the lower power rail (ground) through resistor R4 324. The drain of NMOS transistor 326 is coupled to the upper half of the second inverting stage, the drains of the one or more PMOS transistors 328. The sources of the PMOS transistors 328 and 330 are coupled to the upper power rail (Vcc) and their gates are coupled to the gate of PMOS transistor 304 of the current mirror circuit 314. This arrangement makes them an extension of the current mirror circuit 314 as the gates of the PMOS transistors 328 and 330 are now being driven at the same voltage level as the gates of the PMOS transistors 304, 302 of the current mirror 314, however, the PMOS transistors 328 and 330 are designed one sixth (⅙) the width size of the PMOS transistors 304, 302 of the current mirror 314 and thus each pass a current that is one-sixth the size.

In operation, the current flowing through the NPN BJT 310 sets the voltage $V_{be}$ at the coupled base and collector. The voltage level $V_{be}$ in turn enables the first NPN BJT 312 and sets it into active mode. The voltage level at the collector of the active first NPN BJT 312 sets the current flow in PMOS transistor 304 of the current mirror circuit 314 by pulling down its coupled gate and drain. The current mirror circuit 314 generates two identical currents ($I_1=I_2$). In this, PMOS transistor 304 operates in saturation with its gate tied to its drain, yielding a constant current at $V_{gs}$. As the gate of PMOS transistor 302 is tied to the gate of PMOS transistor 304, and it is of the same size and characteristics, it flows the same current as PMOS transistor 304 with negligible differences. The voltage signal from the collector of the second NPN BJT 310 of the band-gap voltage reference is coupled to the base of the NPN BJT 322 of the first inverting stage of the amplifier 316 through its input 332. The NPN BJT 322, in combination with the PMOS transistor 330, amplifies and inverts the signal and couples it to the gate of the NMOS transistor 326 of the second inverting stage of the amplifier circuit 316 that, in combination with the one or more PMOS transistors 328, re-invert the signal and source it back to the bases of the first and second NPN BJTs 310, 312 through the output of the amplifier 334. More PMOS transistors 328 can be added, or their width adjusted, to increase current amplification. The combination of the two inverting stages make an amplifier that is non-inverting in operation. The constant current set by the feedback loop (second NPN BJT 310 to first NPN BJT 312 to PMOS transistor 304 to PMOS transistor 302) sets the voltage drop across resistor R2 306, which in combination with the voltage level $V_{be}$ gives the band-gap voltage reference circuit 300 output voltage $V_{bg}$ as sampled at the drain of PMOS transistor 302.

The operation of the circuit of FIG. 3 is similar in theory of operation to that of the circuit of FIG. 1, except that current ($I_{B1}+I_{B2}$) is now supplied to the bases of the first and second NPN BJTs 310, 312 by the amplifier circuit. Since the current mirror PMOS transistors 328, 330 of the amplifier circuit 316 are one-sixth the size of the PMOS transistors 302, 304 of the main current mirror circuit 314, they will flow one-sixth the current of the PMOS transistors 302, 304. Thus the current flowing in the collector of NPN BJT 322 is $I_3=I_1/6=I_2/6=I_{C3}$, and since $I_{C3}=\beta_3 I_{B3}$, $\beta_3 I_{B3}=\beta_1 I_{B1}/6$. Since the NPN BJT 322 is identical to the second NPN BJT 310, $I_{B3}=I_{B1}/6$. Therefore the current $I_2$ from the PMOS transistor 302 can be written $I_2=I_{C2}+I_{B3}=I_{C2}+I_{B1}/6$. The current drain $I_{B3}$ from $I_2$ (from $I_2=I_{C2}+I_{B3}$) is effectively one-twelfth that of the above drain of $I_{B1}+I_{B2}$ (from $I_2=I_{C2}+I_{B1}+I_{B2}$) of the band-gap reference circuit of FIG. 1, we can more easily approximate $I_2=I_{C2}+I_{B2}+I_{B1}$ to $I_2=I_{C2}$ and thus $I_2=I_1=I_{C2}=I_{C1}=\beta_2 I_{B2}=_1 I_{B1}$. From $\beta_2 I_{B2}=\beta_1 I_{B1}$, we get $\beta_2 I_0 e^{V_{be}/V_t}=\ominus_1 N I_0 e^{(V_{be}-V_e)/V_t}$, where unlike above we cannot eliminate $\beta_2$ and $\beta_1$ because the operation of the amplifier circuit 316 makes $\beta_2 \neq \beta_1$. Reworking this for $V_e$, gives $v_e=v_t \ln(\beta_1 N/\beta_2)=(kT/q)\ln(\beta_1 N/\beta_2)$, which is the same as $v_e=(I_1+I_{B1})R_1=(I_{C1}+I_{B1})R_1=I_{R1}R_1$, where $I_{R1}$ is the current in resistor R1 308. $I_{R1}$ also can also be stated as $I_{R1}=I_{C1}+I_{B1}=I_{C1}+I_{C1}/\beta_1=I_{C1}(\beta_1+1)/\beta_1$. Additionally, since $I_{C1}=I_1=I_2=I_{R2}$, where $I_{R2}$ is the current through the resistor R2 306, we get $I_{R1}=I_{R2}(\beta_1+1)/\beta_1$ or $I_{R1}=I_{R1}\beta_1/(\beta_1+1)$. Since $I_{R1}=V_e/R_1$, we can restate so $I_{R2}=I_{R1}\beta_1/(\beta_1+1)=V_e\beta_1/R_1(\beta_1+1)$. Substituting for $V_e$ gets $I_{R2}[kT\beta_1 \ln(\beta_1 N/\beta_2)]/qR_1(\beta_1+1)=I_2$. As stated above, the output voltage reference is $V_{bg}=V_{be}+I_2 R_2$ giving $V_{bg}=V_{be}+[R_2 kT\beta_1 \ln(\beta_2)]/qR_1(\beta_1+1)$. The variance of $V_{be}$ of the second NPN BJT 310 is as stated above −2 mV/° C. In the case of the band-gap voltage reference circuit 300 with amplification the variation for N=1 is −2.5 mV/° C. to +2 mV/° C. over an extended temperature range of −40° C. to +100° C., more than acceptable in a Flash memory application. This can be improved upon by modifying N, for example with N=5 the compensation term varies −2 mV/° C. to +1.5 mV/° C. over an extended temperature range of −40° C. to +100° C. Additionally, since β is dependent on operating conditions of the BJT (such as current flowing through the device, operating temperature, etc.) amplified band-gap voltage reference circuit embodiments of the present invention allow for extended lower limit on supply voltage, such as 1.45V.

Figure 4:
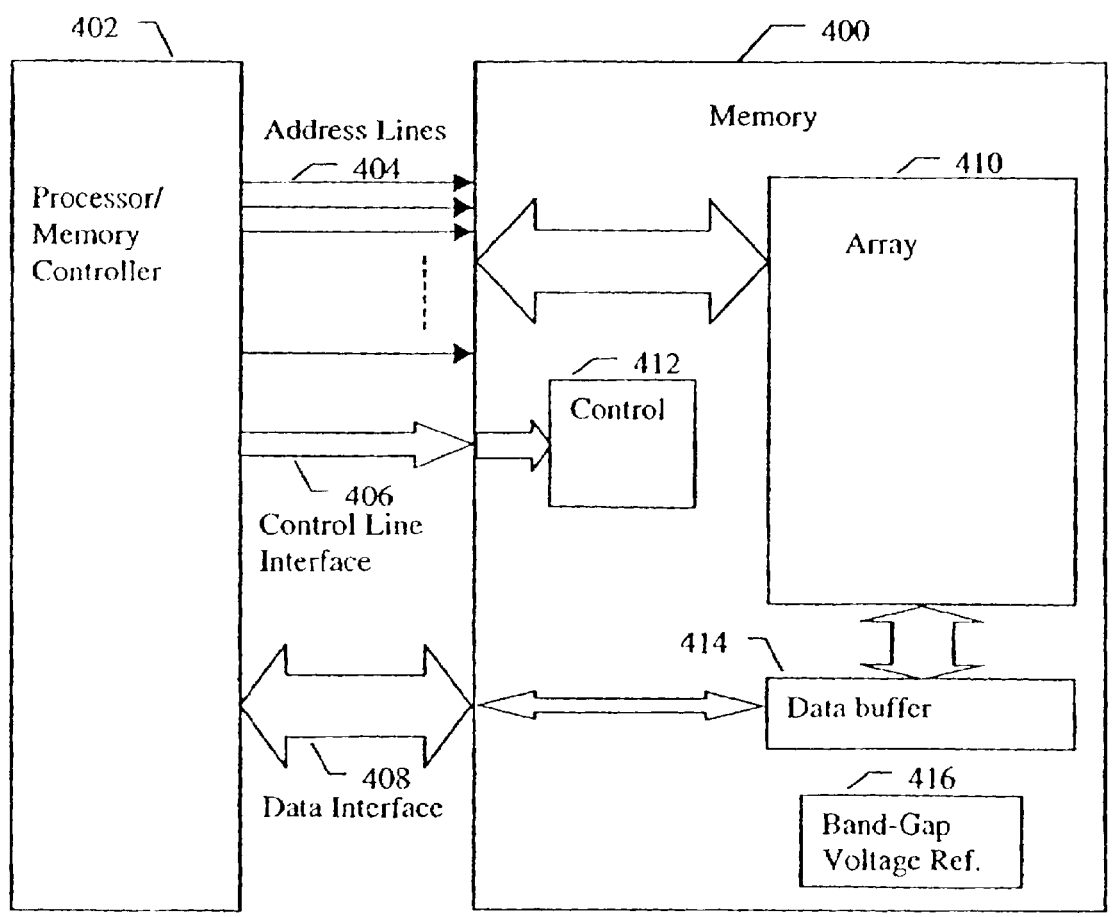
FIG. 4 is a simplified diagram of a system incorporating a memory device with a band-gap voltage reference embodiment of the present invention.

FIG. 4 is a simplified diagram of a system incorporating a memory device with a band-gap voltage reference embodiment of the present invention. FIG. 4 shows an illustration of a memory system, wherein a memory device 400, such as a Flash memory, incorporating a band-gap voltage reference of an embodiment of the present invention is coupled to an external processor or memory controller 402. It is noted that the memory system of FIG. 4 is only shown as an example, and other systems and embodiments of the present invention can include multiple types of other integrated circuits (i.e., a field programmable gate array (FPGA), a volatile memory device, an application specific integrated circuit (ASIC), etc.). Systems containing memory devices are well known in the art and the following description is intended only to be an overview of their operation and provide an example of their operation with an embodiment of the present invention.

In the system of FIG. 4, address values for the memory 400 are received from the processor 402 on the external address bus connections 404. The received address values are stored internal to the memory device and utilized to select the memory cells in the internal memory array 410. Internal to the memory device 400, data values from the bank segments (not shown) are readied for transfer from the memory device 400 by being sensed with the aid of the band-gap voltage reference circuit 416 and copied into internal latch circuits or data buffer 414. Data transfer from or to the memory device 400 begins on the following clock cycle received and transmitted on the bi-directional data interface 408 to the processor 402. Control of the memory device 400 for operations is actuated by the internal control circuitry 412. The control circuitry 412 operates in response external control signals received from the processor 402 on control signal external interface connections 406 and to internal events of the memory 400.

It is noted that alternative manners of assembly and operation of band-gap voltage reference circuits utilizing embodiments of the present invention are possible and should be apparent to those skilled in the art with the benefit of the present disclosure.

Conclusion

An improved band-gap voltage reference apparatus and method is described that incorporates an amplifier to provide for improved compensation and temperature stability to the voltage reference circuit by increasing the effective $h_{FE}$ (also called β) of the bipolar junction transistors (BJTs) used in the band-gap voltage reference circuit. This also allows the band-gap voltage reference circuit to operated with a lower overall power usage and with lower supply voltages. Additionally, the improved band-gap voltage reference apparatus and method also allows for band-gap voltage references to be implemented in integrated circuit technologies that do not have high quality BJTs natively available in the manufacturing process of the technology.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A band-gap voltage reference, comprising:
   a current mirror coupled to an upper power rail;
   a first bipolar junction transistor having a collector coupled to the current mirror through a first resistor, and an emitter coupled to a lower power rail;
   a second bipolar junction transistor having a collector coupled to the current mirror, and a base coupled to a base of the first bipolar transistor;
   a second resistor coupled between an emitter of the second bipolar junction transistor and the lower power rail; and
   an amplifier circuit having an input coupled to the collector and an output coupled to the base of the first bipolar junction transistor.

2. The band-gap voltage reference of claim 1, wherein the amplifier comprises:
   a capacitor coupled between the input and output;
   a third bipolar junction transistor having a base coupled to the input through a third resistor, and an emitter coupled to the lower power rail;
   a NMOS transistor having a source coupled to the lower power rail through a fourth resistor, a gate of the NMOS transistor is coupled to a collector of the third bipolar junction transistor, and a drain of the NMOS transistor is coupled to the output;
   a first PMOS transistor having a source coupled to the upper power rail, a gate of the first PMOS transistor is coupled to the current mirror, and a drain of the first PMOS transistor is coupled to the collector of the third bipolar junction transistor; and
   one or more second PMOS transistors wherein a source of each of the one or more second PMOS transistors are coupled to the upper power rail, a gate of each of the one or more second PMOS transistors are coupled to the gate of the first PMOS transistor, and a drain of the one or more second PMOS transistors are coupled to the output.

3. The band-gap voltage reference of claim 1, wherein the amplifier is compensated to prevent oscillation.

4. The band-gap voltage reference of claim 1, wherein a gain of the amplifier is greater than six.

5. The band-gap voltage reference of claim 1, wherein a ratio between a base-emitter area of the first bipolar junction transistor and a base-emitter area of the second bipolar junction transistor is greater than 2.

6. The band-gap voltage reference of claim 1, wherein the current mirror comprises:
   a reference coupled to a follower.

7. The band-gap voltage reference of claim 6, wherein the reference further comprises a first PMOS transistor having a source coupled to the upper power rail, and the follower further comprises a second PMOS transistor having a source coupled to the upper power rail and a gate of the second PMOS transistor coupled a drain of the second PMOS transistor and to a gate of the first PMOS transistor.

8. The band-gap voltage reference of claim 2, wherein the widths of the first PMOS transistor and the one or more second PMOS transistors are varied.

9. An integrated circuit, comprising:
   a first internal circuit with an output;
   a second internal circuit with an input; and
   a band-gap voltage reference coupled to the output of the first internal circuit and a voltage reference output of the band-gap voltage reference coupled to the input of the second internal circuit, wherein the band-gap voltage reference comprises,
   a current mirror coupled to a first power rail;
   a first bipolar junction transistor having a collector coupled to the current mirror through a first resistor, and an emitter coupled to a second power rail;
   a voltage reference output coupled to the first resistor and to the current mirror;
   a second bipolar junction transistor having a collector coupled to the current mirror, and a base coupled to a base of the first bipolar transistor;
   a second resistor coupled between an emitter of the second bipolar junction transistor and the second power rail; and
   an amplifier circuit having an input coupled to the collector of the first bipolar junction transistor and an output coupled to the base of the first bipolar junction transistor.

10. The integrated circuit of claim 9, wherein the amplifier circuit of the band-gap voltage reference comprises:

a capacitor coupled between the input and the output;

a third bipolar junction transistor having a base coupled to the input through a third resistor, and an emitter coupled to the second power rail;

a NMOS transistor having a source coupled to the second power rail through a fourth resistor, a gate of the NMOS transistor is coupled to a collector of the third bipolar junction transistor, and a drain of the NMOS transistor is coupled to the output;

a first PMOS transistor having a source coupled to the first power rail, a gate of the first PMOS transistor is coupled to the current mirror, and a drain of the first PMOS transistor is coupled to the collector of the third bipolar junction transistor; and one or more second PMOS transistors wherein a source of each of the one or more second PMOS transistors are coupled to the first power rail, a gate of each of the one or more second PMOS transistors are coupled to the gate of the first PMOS transistor, and a drain of the one or more second PMOS transistors are coupled to the output.

11. The integrated circuit of claim 9, wherein the amplifier circuit of the band-gap voltage reference is compensated to prevent oscillation.

12. The integrated circuit of claim 9, wherein a gain of the amplifier circuit of the band-gap voltage reference is greater than six.

13. The integrated circuit of claim 9, wherein a ratio between a base-emitter area of the first bipolar junction transistor of the band-gap voltage reference and a base-emitter area of the second bipolar junction transistor of the band-gap voltage reference is greater than 2.

14. The integrated circuit of claim 9, wherein the current mirror comprises:
a reference coupled to a follower.

15. The integrated circuit of claim 14, wherein the reference further comprises a first PMOS transistor having a source coupled to the first power rail, and the follower further comprises a second PMOS transistor having a source coupled to the first power rail and a gate of the second PMOS transistor coupled a drain of the second PMOS transistor and to a gate of the first PMOS transistor.

16. The integrated circuit of claim 10, wherein the widths of the first PMOS transistor and the one or more second PMOS transistors are varied.

17. A band-gap voltage reference, comprising:
a current mirror circuit comprising,
  a first PMOS transistor having a source coupled to a first power rail; and
  a second PMOS transistor having a source coupled to the first power rail and a gate of the second PMOS transistor coupled a drain of the second PMOS transistor and to a gate of the first PMOS transistor;
a first NPN bipolar junction transistor having a collector coupled to a drain of the first PMOS transistor of the current mirror circuit through a first resistor, and an emitter coupled to a second power rail;
a second NPN bipolar junction transistor that has a base-emitter junction area that is larger than a base-emitter junction area of the first NPN bipolar junction, having a collector coupled to a drain of the second PMOS transistor of the current mirror circuit, and a base of the second NPN bipolar junction transistor coupled to a base of the first NPN bipolar transistor;
a second resistor coupled between an emitter of the second NPN bipolar junction transistor and the second power rail; and an amplifier circuit having an input coupled to the collector of the first NPN bipolar junction transistor and an output coupled to the base of the first NPN bipolar junction transistor, the amplifier circuit comprising,
  a capacitor coupled between the input and the output;
  a third NPN bipolar junction transistor having a base coupled to the input through a third resistor, and an emitter coupled to the second power rail;
  a NMOS transistor having a source coupled to the second power rail through a fourth resistor, a gate coupled to a collector of the third NPN bipolar junction transistor, and a drain coupled to the output;
  a third PMOS transistor having a source coupled to the first power rail, a gate coupled to the gate of the second PMOS transistor of the current mirror circuit, and a drain coupled to the collector of the third NPN bipolar junction transistor; and
  one or more fourth PMOS transistors having a source of each of the one or more fourth PMOS transistors coupled to the first power rail, a gate of each of the one or more fourth PMOS transistors coupled to the gate of the second PMOS transistor of the current mirror circuit, and a drain of the one or more fourth PMOS transistors coupled to the output.

18. A non-volatile memory, comprising:
a non-volatile memory array;
a controller circuit; and
at least one band-gap voltage reference comprising,
  a current mirror coupled to a positive power rail;
  a first bipolar junction transistor having a collector coupled to the current mirror through a first resistor, and an emitter coupled to a negative power rail;
  a second bipolar junction transistor having a collector coupled to the current mirror, and a base coupled to a base of the first bipolar transistor;
  a second resistor coupled between an emitter of the second bipolar junction transistor and the negative power rail; and
    an amplifier circuit having an input coupled to the collector and an output coupled to the base of the first bipolar junction transistor.

19. The non-volatile memory of claim 18, wherein the amplifier circuit of the at least one band-gap voltage reference comprises:
a capacitor coupled between the input and the output;
a third bipolar junction transistor having a base coupled to the input through a third resistor, and an emitter coupled to the negative power rail;
a NMOS transistor having a source coupled to the negative power rail through a fourth resistor, a gate of the NMOS transistor is coupled to a collector of the third bipolar junction transistor, and a drain of the NMOS transistor is coupled to the output;
a first PMOS transistor having a source coupled to the positive power rail, a gate of the first PMOS transistor is coupled to the current mirror, and a drain of the first PMOS transistor is coupled to the collector of the third bipolar junction transistor; and
one or more second PMOS transistors wherein a source of each of the one or more second PMOS transistors are coupled to the positive power rail, a gate of each of the one or more second PMOS transistors are coupled to the gate of the first PMOS transistor, and a drain of the one or more second PMOS transistors are coupled to the output.

20. The non-volatile memory of claim 18, wherein the amplifier circuit of the at least one band-gap voltage reference is compensated to prevent oscillation.

21. The non-volatile memory of claim 18, wherein a gain of the amplifier circuit of the at least one band-gap voltage reference is greater than six.

22. The non-volatile memory of claim 18, wherein a ratio between a base-emitter area of the first bipolar junction transistor of the at least one band-gap voltage reference and a base-emitter area of the second bipolar junction transistor of the at least one band-gap voltage reference is greater than 2.

23. The non-volatile memory of claim 18, wherein the current mirror comprises:

a reference coupled to a follower.

24. The non-volatile memory of claim 23, wherein the reference further comprises a first PMOS transistor having a source coupled to the positive power rail, and the follower further comprises a second PMOS transistor having a source coupled to the positive power rail and a gate of the second PMOS transistor coupled a drain of the second PMOS transistor and to a gate of the first PMOS transistor.

25. The non-volatile memory of claim 19, wherein the widths of the first PMOS transistor and the one or more second PMOS transistors are varied.

26. A method of operating a band-gap voltage reference that comprises a current mirror coupled to an upper power rail, a first bipolar junction transistor having a collector coupled to the current mirror through a first resistor, and an emitter coupled to a lower power rail, a second bipolar junction transistor having a collector coupled to the current mirror, and a base coupled to a base of the first bipolar transistor, a second resistor coupled between an emitter of the second bipolar junction transistor and the lower power rail, and an amplifier circuit having an input coupled to the collector and an output coupled to the base of the first bipolar junction transistor, comprising:

operating the amplifier circuit to provide an amplified current from the collector of the first bipolar junction transistor to the base of the first bipolar junction transistor.

27. The method of claim 26, wherein operating the amplifier to provide an amplified current from the collector of the first bipolar junction transistor to base of the first bipolar junction transistor further comprises operating the amplifier to provide a current wherein the amplifier is compensated to prevent oscillation.

28. The method of claim 26, wherein operating the amplifier to provide an amplified current from the collector of the first bipolar junction transistor to base of the first bipolar junction transistor further comprises operating the amplifier to provide a current where a gain of the amplifier is greater than six.

29. The method of claim 26, further comprising:

selectively adjusting a gain of the amplifier to provide an improved temperature compensated voltage reference.

30. The method of claim 26, wherein a ratio between a base-emitter area of the first bipolar junction transistor and a base-emitter area of the second bipolar junction transistor is greater than 2.

31. The method of claim 26, further comprising:

selectively adjusting a ratio between a base-emitter area of the first bipolar junction transistor of the at least one band-gap voltage reference and a base-emitter area of the second bipolar junction transistor to provide an improved temperature compensated voltage reference.

32. The method of claim 26, wherein the current mirror comprises:

a reference coupled to a follower.

* * * * *